United States Patent [19]
Watson

[11] Patent Number: 5,959,427
[45] Date of Patent: Sep. 28, 1999

[54] METHOD AND APPARATUS FOR COMPENSATING FOR REACTION FORCES IN A STAGE ASSEMBLY

[75] Inventor: Douglas C. Watson, Campbell, Calif.

[73] Assignee: Nikon Corporation, Japan

[21] Appl. No.: 09/034,627

[22] Filed: Mar. 4, 1998

[51] Int. Cl.⁶ .................................................. G05B 11/00
[52] U.S. Cl. ........................ 318/687; 318/560; 318/671; 414/788
[58] Field of Search ..................... 318/687, 560, 318/671, 640, 35; 414/788

[56] References Cited

U.S. PATENT DOCUMENTS

| | | | |
|---|---|---|---|
| 4,525,659 | 6/1985 | Imahashi et al. | 318/649 |
| 4,812,725 | 3/1989 | Chitayat | 318/625 |
| 5,022,619 | 6/1991 | Mamada | 248/178 |
| 5,744,924 | 4/1998 | Lee | 318/568.17 |

*Primary Examiner*—Brian Sircus
*Assistant Examiner*—Rita Leykin
*Attorney, Agent, or Firm*—Skjerven, Morrill, MacPherson, Franklin & Friel LLP

[57] ABSTRACT

A stage assembly which includes a stage which moves on a base, where the base is suspended on a foundation, minimizes disturbance to the base caused by linear acceleration of the stage during its movement. Reaction cancellation forces are applied through the stage center of gravity, hence there is no uncancelled reaction moment and no disturbance of the base stability. The net reaction cancellation force is applied in line with the stage center of gravity and parallel to the stage direction of travel. Alternatively, the base is isolated from the reaction forces by a rigid linkage between the stage linear actuator and a foundation.

15 Claims, 7 Drawing Sheets

METHOD AND APPARATUS FOR COMPENSATING FOR REACTION FORCES IN A STAGE ASSEMBLY

FIELD OF THE INVENTION

This invention relates to precision motion stages and more particularly to the effects of reaction forces in such stages assembly.

BACKGROUND

Stages are well known; they are typically used for precision motion where an object (for instance a workpiece) is carried on a stage. Stages are available which move in only one direction (i.e. x direction only), in two directions, (x, y) in three directions (x, y, z) or in six degrees of freedom. Such stages are used for instance in machine tools and lithography apparatus. Typically in lithography the stage carries an object which is a wafer or a reticle. The stage is supported by and moves in the x (or x and y) axis directions relative to a base structure which also supports other components of the system. This base structure is typically supported on a foundation by a spring/damper system to isolate the base structure and stage from outside vibrations. Such vibrations, if transmitted to the base structure, could cause relative position errors between the base structure and stage.

If the stage drive mechanism is mounted between the stage and base structure, the forces which accelerate and decelerate the stage also act upon the base structure equally and in the opposite direction. These reaction forces can cause unwanted motion and vibration in the base structure. This makes precision motion and positioning of the stage relative to the base much more difficult.

Hence it is known that is desirable to avoid effects of reaction forces applied to the base structure; see U.S. Pat. Nos. 4,525,659 and 5,172,160.

Figure 1:
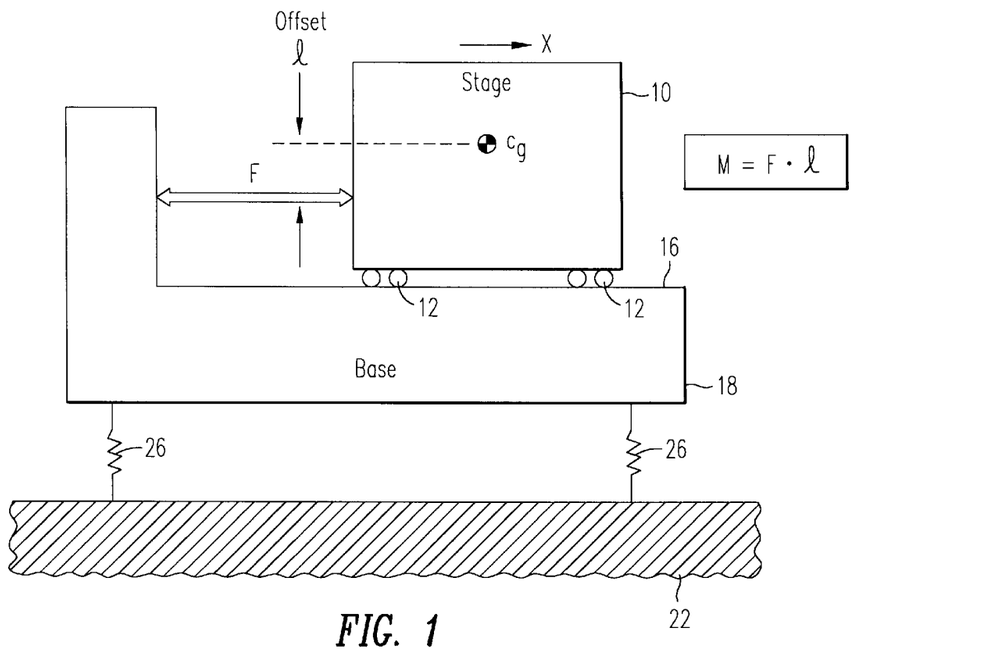
FIG. 1 shows a stage assembly with an acceleration force applied to the stage, illustrating the technical problem addressed by the present invention.

Present FIG. 1 shows the technical problem of reaction force to which the present invention is directed. The stage 10 (shown here in a side view) rides on bearings 12 on a flat surface 16 of a base structure 18. (It is to be understood that this drawing and the other drawings which form a portion of this disclosure are simplified to show only essential elements.)

The actual stage 10 is a fairly complex structure, including a chuck for holding down the reticle or wafer or other workpiece, fiducial marks, interferometer mirrors, and other elements such as leveling actuators, not shown as being conventional. Moreover the base structure 18 is more complex than illustrated in FIG. 1, and is typically large and massive including, for instance, a large flat steel or granite structure with a precision machined flat surface 16. The bearings 12 are for instance air bearings or other types of bearings. The stage 10 shown in FIG. 1 and the other figures is capable of movement in only one direction, e.g. the illustrated x axis direction. In other cases, such a stage is also capable of y axis direction motion (into the plane of the figure), and/or in the z axis direction but these cases are not shown for simplicity. A structure as in FIG. 1 can be extended to the case where two independent stages, e.g. for a wafer and reticle, are mounted on the same base structure.

The stage 10 in FIG. 1 has a center of gravity cg (as does any body). The base 18 is mounted on a foundation 22, for instance the floor of a building. Foundation 22 is also referred to as "the ground" since foundation 22 is rigidly coupled to the earth. The base 18 is not rigidly coupled to the foundation 22, in order to isolate the base 18 from any vibration present in the foundation 22. Hence an isolation structure 26 couples the base 18 to the foundation 22. For instance, isolation structure 26 is a set of springs, air jacks, dampers, and/or other types of passive or active vibration dampening devices.

The stage 10 moves as shown in the x direction, back and forth on the base surface 16. This movement is conventionally accomplished by a linear actuator of any type (not shown). The linear actuator is e.g. a magnetic linear motor having one element (the coil) mounted on the stage 10 and a second element (the magnet track) mounted on base 18. The linear actuator can also be a lead screw, ball screw, belt or chain drive, hydraulic device, or any other linear drive device.

Hence a single degree of freedom (x direction) stage 10 is mounted on the base structure 18 which is suspended by isolation structure 26 on the foundation 22, and stage acceleration force F is applied between the stage 10 and the base 18 to move the stage 10 in direction x. Force F causes the stage to accelerate in the x direction and a reaction force −F (equal in magnitude and in the opposite direction to force F) causes the base 18 to move in the opposite direction and can excite flexible vibration modes in the base 18.

Figure 2:
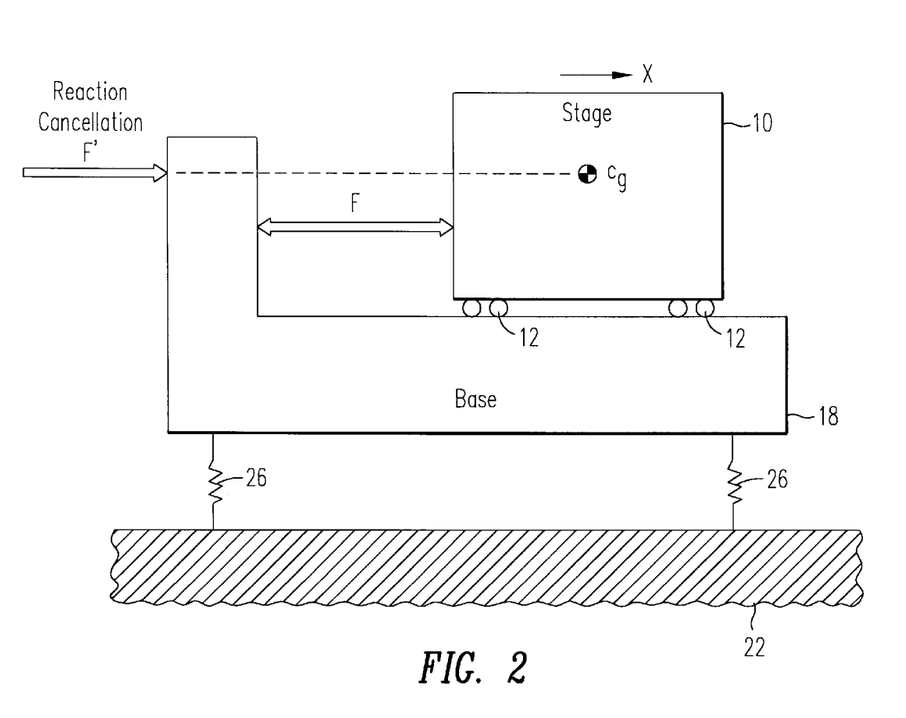
FIG. 2 shows exertion of a reaction cancellation force in accordance with this invention.

The net reaction on the base 18 in FIG. 2 consists of both a reaction force and a reaction moment. The reaction moment is m, equal to the offset distance 1 of the force F from a line passing through the stage center of gravity cg times the force F ($m=1\times F$). This reaction moment m is transferred to the base 18 through the bearings 12 supporting the stage 10.

Motion of and vibration in the base 18 causes a relative position error for the stage 10, which requires that the stage 10 be driven forward and backward to maintain a constant position relative to the oscillating base 18; this can reduce the positioning accuracy and increase the settling time. It is of course important in the lithography field that the system not be subject to such vibration forces, in order to preserve the accuracy of the lithography.

Hence it would be desirable to overcome these problems, thereby to reduce settling time and improve lithography accuracy.

SUMMARY

The present invention is directed to compensating for the above-described reaction forces both actively by exerting a reaction cancellation force, and passively by isolating the reaction force. In either case, a compensation force vector is exerted that has an axis passing through the stage center of gravity and which is parallel to the stage direction of travel, and which has a magnitude equal to the mass of the stage multiplied by the linear acceleration of the stage in the direction of travel.

Therefore in accordance with one aspect of the invention, a reaction cancellation force vector is exerted on the base through the stage center of gravity and parallel to the direction of stage travel. In certain embodiments the reaction cancellation force is exerted by actuators (e.g. voice coil motors or other types of force exerting devices) which exert a net force through the center of gravity of the stage and parallel to direction of stage travel. By doing so there is no reaction moment present to disturb the stability of the base, thereby improving the precision of the stage assembly.

Hence in accordance with this invention, a net reaction cancellation force vector is applied to the base in line with the stage center of gravity and also parallel to the stage direction of travel. This is true in accordance with the invention regardless of the location of the linear actuator(s) which actually drive the stage.

In accordance with another aspect of this invention, the reaction force is isolated from the base whereby the stage acceleration forces are conducted directly to the ground rather than disturbing the base.

Advantageously, a stage assembly in accordance with this invention improves base stability during stage acceleration/deceleration, which can significantly reduce mechanical settling time of the stage whenever it is moved.

BRIEF DESCRIPTION OF THE DRAWINGS

FIGS. 7a, 7b–11 show exertion of a reaction cancellation force in a system having six degrees of freedom of motion.

DETAILED DESCRIPTION

In accordance with the invention as shown in FIG. 2, showing structures identical to those of FIG. 1, a reaction cancellation force vector F' (equal in magnitude and opposite in direction to linear actuator reaction force F) is applied to the base 18 along an axis (indicated by the dotted line) lying parallel to the stage 10 direction of travel x and passing through the center of gravity cg of the stage 10. If the stage linear actuator is not aligned with the direction of travel, then the reaction cancellation force magnitude must equal the component of the stage linear actuator force in the stage direction of travel. Also, if there is friction or other force resisting motion between the stage and base in the stage travel direction, then this force would be subtracted from the reaction cancellation force magnitude. In other words, the net reaction cancellation force should be equal in magnitude to the mass of the stage multiplied by the acceleration of the stage in the stage travel direction. The stage assembly shown in FIG. 2 is not shown in detail; for instance, it could be of the type shown in U.S. Pat. No. 5,528,118 to Martin E. Lee, incorporated herein by reference in its entirety.

Hence FIG. 2 shows an approach for exerting a reaction cancellation vector force in accordance with this invention, but not a specific mechanism for carrying this out. It will be understood by one of ordinary skill in the art that a number of different mechanisms and methods are available for applying the reaction cancellation force vector F'. While embodiments of these are disclosed below, these are not intended to be limiting.

Figure 3:
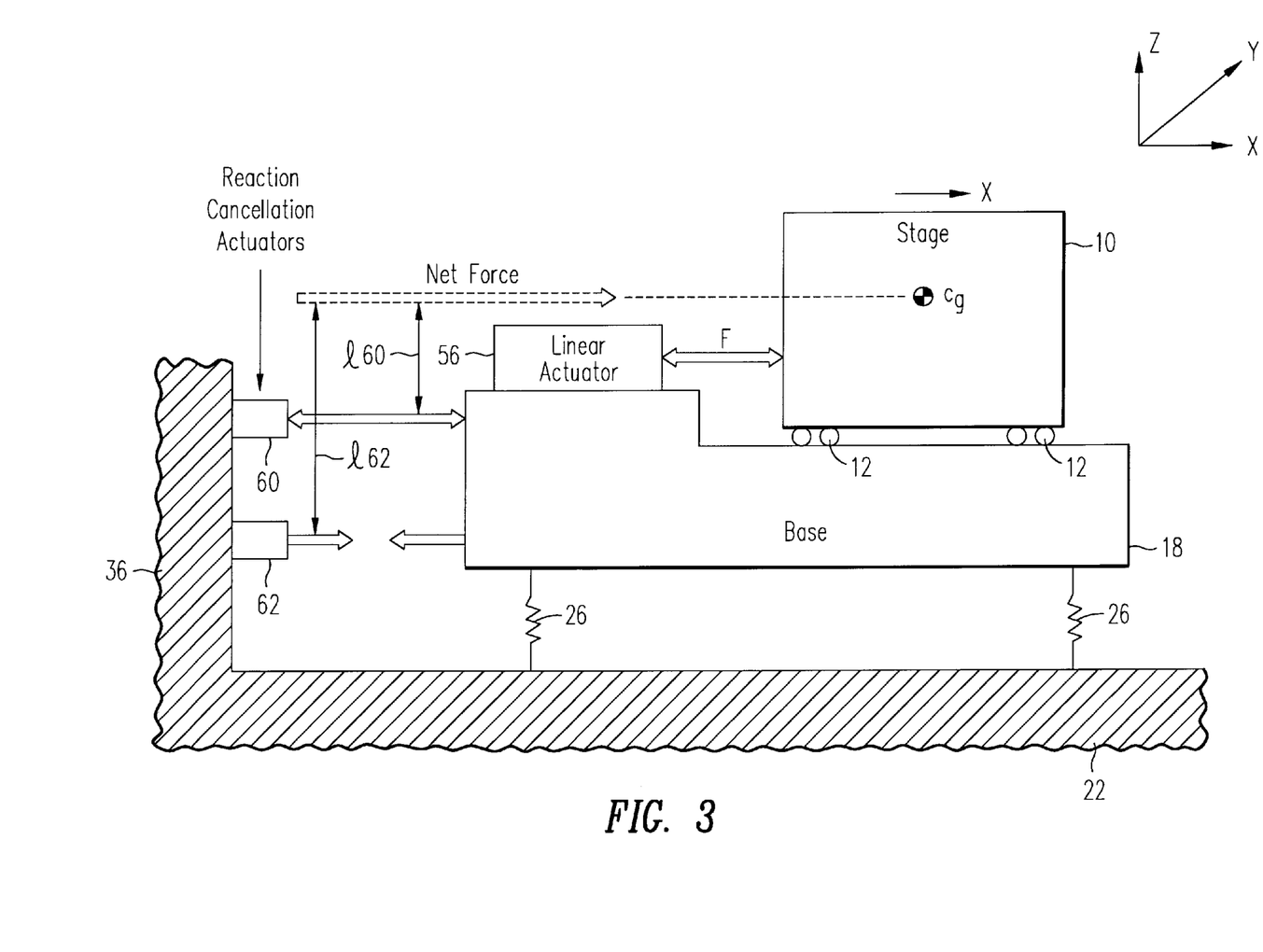
FIG. 3 shows an optional positioning of reaction-cancellation actuators in accordance with FIG. 2.

In one embodiment illustrated in FIG. 3, the linear actuator 56 which drives stage 10 in the direction x is conventionally rigidly mounted to the base 18; thereby all reaction forces F generated by linear actuator 56 are transmitted directly to the base 18. In FIG. 3 only one portion of the linear actuator 56 is shown mounted on base 18; for instance, if the linear actuator 56 is a magnetic linear motor, as described above, the magnetic track of linear motor 56 is mounted on the base 18 and the associated motor coil (not shown) is mounted to the stage 10. In general and as shown in FIG. 3, the linear actuator 56 need not apply force in line with the stage 10 center of gravity, so there may be reaction moments applied to the base 18 through the stage bearings 12.

In this case external reaction-cancellation actuators, e.g. actuators 60 and 62, are coupled between the base 18 and a vertical extension 36 of the foundation 22 (or extension 36 may rest directly on the ground). Actuators 60 and 62 apply forces directly to the side of the base 18 which cancel the other reaction forces and moments in the stage assembly. The forces applied by the reaction-cancellation actuators 60, 62 are applied such that any net force vector (with a zero moment) acts in line with the direction of travel x of stage 10 and in line with the center of gravity cg of the stage 10. The net force F is: $F = F_{60} - F_{62}$ where $F_{60}$, $F_{62}$ are respectively the forces exerted by actuators 60, 62. The net moment $= -(F_{60} \times l_{60}) + (F_{62} \times l_{62}) = 0$ where $l_{60}$, $l_{62}$ are the distances shown in FIG. 3. The reaction-cancellation actuators 60, 62 are for instance electric motor devices such as voice coil motors which are driven by an open loop (no position feedback) control system that causes them to exert a force on base 18 that is proportional to the stage 10 acceleration.

The reaction forces (and net reaction-cancellation forces) are in line with the direction of travel x of stage 10, which may or may not be exactly aligned with the force vector exerted by linear actuator 56. This reaction force is in line with the stage 10 center of gravity cg regardless of the linear actuator drive type, including for instance a crank and rod-type arrangement rather than a magnetic linear motor. The forces and moments are canceled in both axes (y and z) orthogonal to the axis of the direction of travel x. (The x, y, z axes are illustrated for purposes of reference in FIG. 3.)

There is no requirement to include two actuators 60, 62 as in FIG. 3; there may be only one actuator 60, or more than two such actuators in other embodiments, depending on system design constraints. For instance, if the force exerted by the reaction-cancellation actuator is aligned with both the stage center of gravity and is parallel to the stage direction of travel, only one reaction-cancellation actuator 60 is needed.

In order to maintain isolation from vibration in the foundation 22, actuators 60, 62 are capable of applying force in the x-direction, independent of position and velocity in any direction. Hence it is desirable that the actuators 60, 62 mechanically have zero "stiffness" and "damping", as does a voice coil motor. Zero (or low) stiffness or damping means that the exerted force is independent of actuator position or velocity. A mechanical screw drive reaction-cancellation actuator, while possible, would tend to have excessive stiffness. The reaction-cancellation actuators 60, 62 alternatively are pneumatic actuators or a torque motor with an arm or other types of actuators; see for instance Van Eijk U.S. Pat. No. 5,172,160 for a description of a torque motor.

It is to be understood that the bearings 12 in FIG. 3 are e.g. roller bearings, air bearings, other fluid bearings or other types of bearings. While the linear actuator 56 may be a magnetic linear motor, alternatively as stated above it is another type of actuator which provides linear motion, and need not be a motor, but may be for instance a mechanical linkage or pneumatic or hydraulic drive.

In operation, in the FIG. 3 embodiment one measures the force applied by stage linear actuator 56 to stage 10, for instance by measuring the amount of electric current supplied to linear actuator 56. This amount of current is measured by a control system which determines the corresponding amount of force to be applied by the reaction-cancellation actuators 60, 62 and provides a corresponding electric current to the actuators 60, 62. Alternatively, the stage acceleration is measured. Typically the reaction force is matched by the actuators (e.g. voice coil motors) 60, 62 so that the coil of each voice coil motor is not moving at any instant, i.e. the base is undisturbed.

Figure 4:
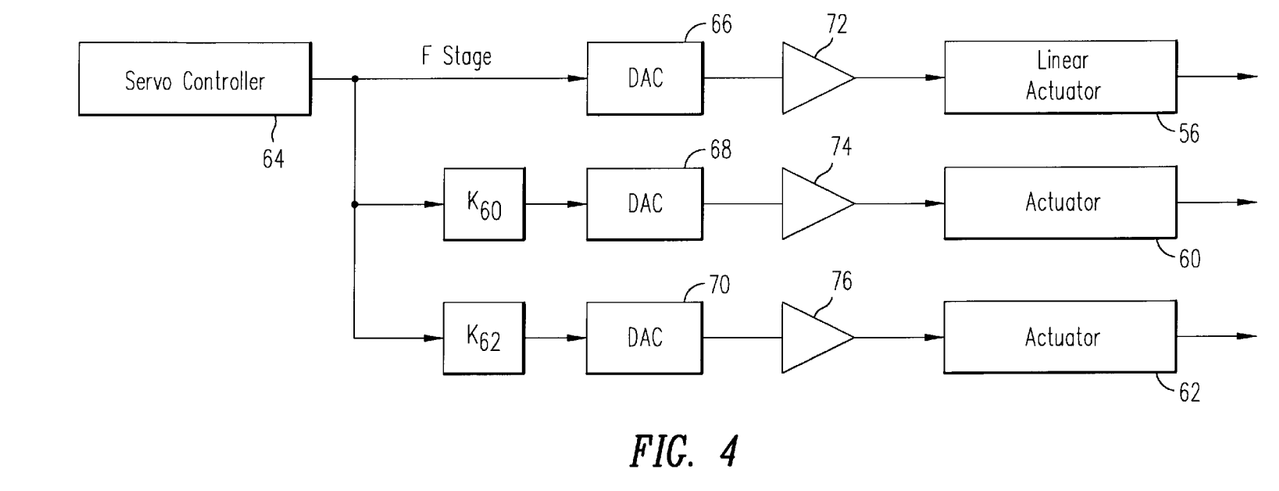
FIG. 4 shows a control system for the FIG. 3 structure.

Such a control system is shown in block diagram form in FIG. 4, including a servo controller 64 (e.g. computer or microprocessor) outputting a signal $F_{stage}$ to drive the stage 10 via linear actuator 56. Signal $F_{stage}$ is applied to a DAC 66 (digital to analog converter), and to two constant multipliers $K_{60}$, $K_{62}$ which each drive a DAC, respectively 68, 70. DAC 66 drives an amplifier 72, which drives the linear actuator 56. DACs 68, 70 respectively drive single phase current drive amplifiers 74, 76 which in turn respectively drive actuators 60, 62. Constant $K_{62}$ is e.g. a negative value and $K_{60}$ is a positive value.

Figure 5:
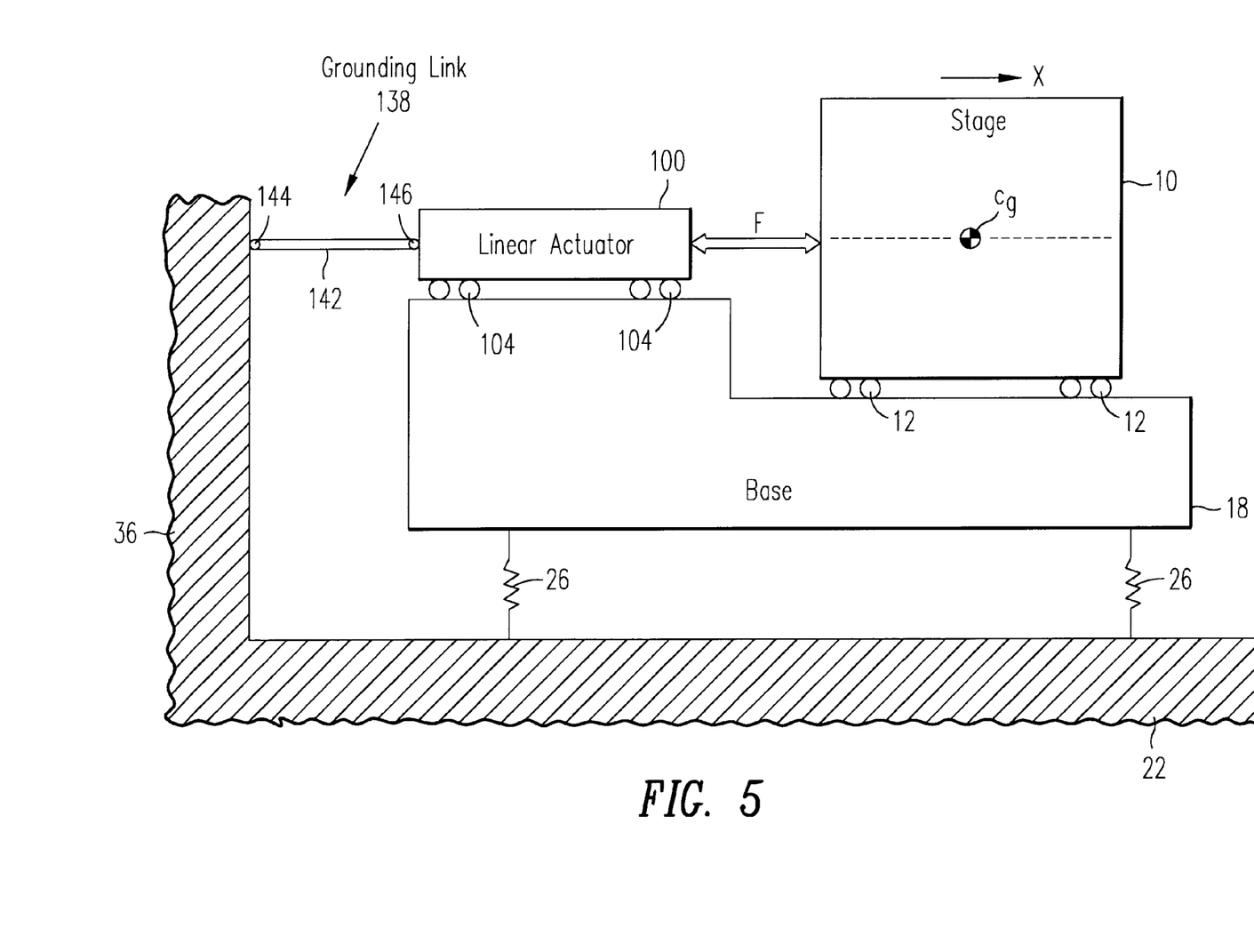
FIG. 5 shows use of a grounding link to isolate the reaction force.

FIG. 5 shows one embodiment for carrying out reaction force isolation in accordance with the invention. FIG. 5 illustrates a reaction force isolation mechanism which isolates the base 18 from the reaction force by mounting the linear actuator 100 which moves stage 10 on a flexible mounting, e.g. bearings or flexures 104, on base 18. (In FIG. 3 the corresponding linear actuator 56 is rigidly mounted on the base 18).

In FIG. 5 the linear actuator 100 is mounted to exert force along an axis parallel to the stage direction of travel and through the stage 10 center of gravity cg. The linear actuator 100 is also coupled to vertical extension 36 of the foundation 22 via a flexible but axially stiff link assembly 138, also referred to herein as a "grounding link." It is to be understood that as in FIG. 3, vertical extension 36 of the foundation is rigidly connected to the ground and/or to remainder of the foundation 22, for instance by a metal framework.

The grounding link assembly 138 typically includes an e.g. metal rod grounding link member 142 which is coupled by joints 144, 146 respectively to the foundation extension 36 and the linear actuator 100. Joints 144, 146 are e.g. ball joints, pin joints, hinges, flexures, or equivalents. Assembly 138 directly transmits the reaction force to the foundation extension 36. The grounding link member 142 lies parallel to the direction of stage travel x. Thereby, no reaction moment acts on the base 18 because all accelerating forces are applied through the center of gravity cg of the stage 10. It has been found beneficial to minimize the moment of inertia of the grounding link assembly 138 in order to minimize transmission of ground vibration to the base 18 via the grounding link assembly 138. Inertia is minimized by reducing the grounding link assembly mass, so there is little vertical force at the grounding link assembly's right end when the base 18 moves vertically relative to the foundation 22.

Figure 6:
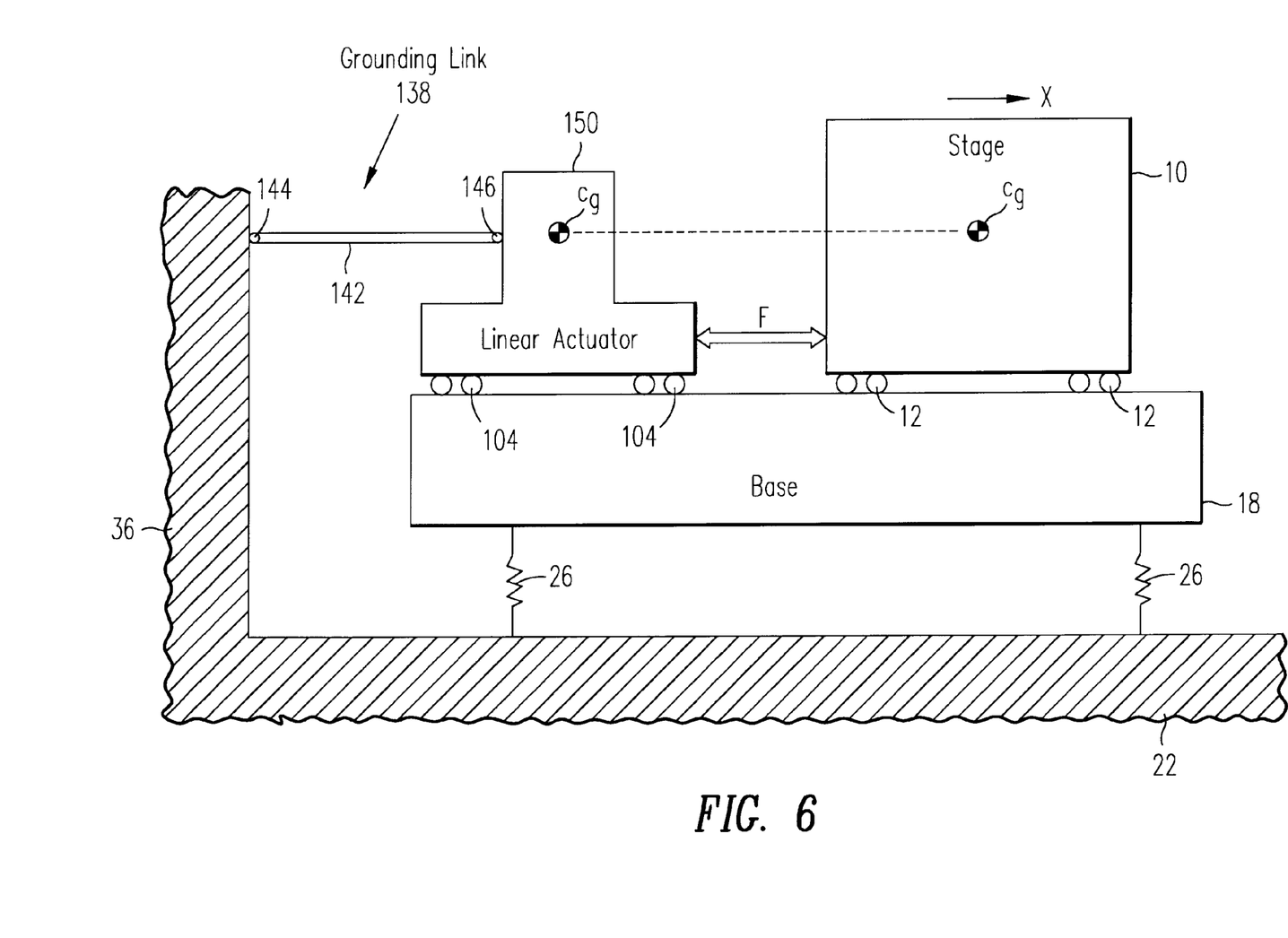
FIG. 6 shows a variant of the structure of FIG. 5.

FIG. 6 shows another embodiment similar in most respects to that of FIG. 5, except that in this case a different linear actuator 150 is used, whereby the linear actuator force F is offset from the center of gravity cg of the stage 10 if the grounding link assembly 138 is in line with the stage 10 center of gravity and the linear axis defined by member 142 of the grounding link assembly 138 lies parallel to the stage 10 direction x of travel. Also in this case the center of gravity cg of the linear actuator 150 is in line with the stage 10 center of gravity cg in order to minimize transmission of ground vibration to the base 18.

In this case, the reaction moment applied by the stage 10 to the base 18 by the stage bearings 12 is canceled by the moment transferred by the linear actuator 150 to the base 18 by linear actuator bearings (or flexures or equivalent) 104.

Preferably the motion of the base 18 relative to the foundation 22, 36 is small and the grounding link member 142 is long, in order to maintain parallelism between the stage 10 direction of travel x and the linear axis defined by the grounding link member 142. Clearly if the base 18 is vibrating up and down by large amounts and the grounding link member 142 is relatively short, any such parallelism would undesirably be lost, resulting in off-axis force components which would tend to disturb the base.

While the above-disclosed embodiments pertain to single direction stage travel, i.e. in the x axis direction, the invention is readily applicable to a two-dimensional (x, y axis) or 3 dimensions (x, y, z) stage by provision of a second reaction force cancellation mechanism operating in the y axis direction. The net force in the x, y and/or z directions must always be parallel to stage travel and through the stage center of gravity.

In another embodiment, the present invention includes a system with full six degrees of freedom motion (along the x, y, z, $\theta_x$, $\theta_y$, and $\theta_z$ axes) by providing additional actuators and adjusting relative forces between the actuators as a function of stage center of gravity position, acceleration direction, and acceleration magnitude. Net force and moment from reaction-force compensation are aligned with position and direction of the moving stage's center of gravity and direction. The magnitude of the net force equals the stage's moving mass multiplied by its linear acceleration. Also, the magnitude of the net moment must equal the stage's moment of inertia multiplied by its angular acceleration.

Figure 7A:
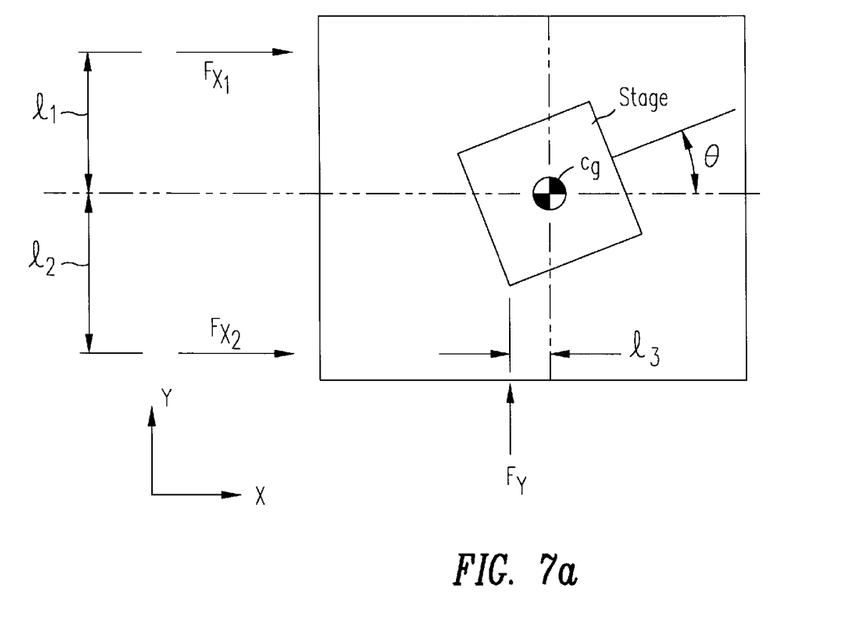

As shown in FIG. 7a where the stage is in plan view, where $I_{zz}$ is the moment of inertial about the cg and the forces exerted by the various actuators are F and M is moment:

Net $M_{stagecg} = I_{ZZ\ stage\ cg}\ \theta_{stage}$ so $(-F_{x1})(l_1)+(F_{x2})(l_2)-(F_y)(l_3)=I_{ZZ}\ \theta_{stage}$ $\Sigma F_x = m_{stage,x} \ddot{x}_{stage}$ so $F_{x1}+F_{x2}=m_{stage,x}\ddot{x}_{stage}$ $\Sigma F_y = m_{stage,y} \ddot{y}_{stage}$ so $F_y = m_{stage,y}\ddot{y}_{stage}$.

There being three equations for F and three unknowns, these equations are solvable.

Figure 7B:
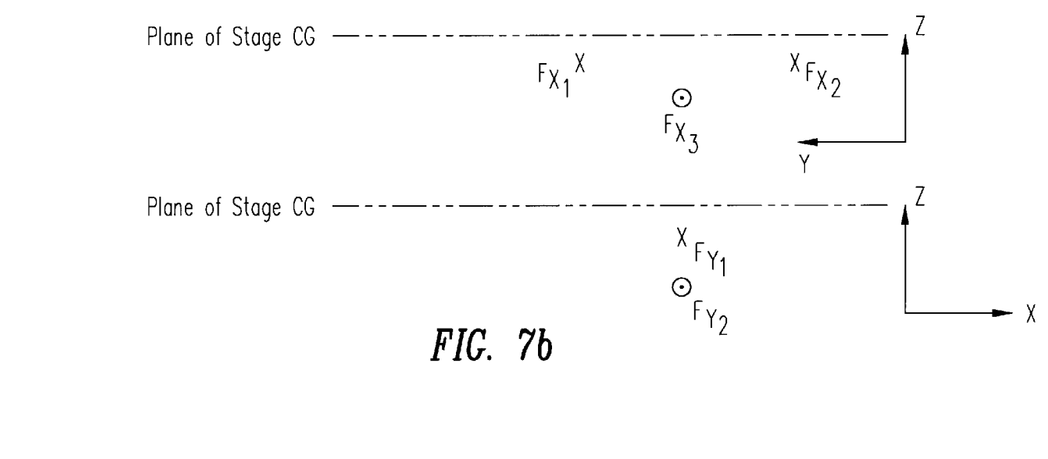

A minimum of three actuators is required to control motion in three degrees of freedom, but forces $F_{x1}$, $F_{x2}$, and $F_y$ must be in the same z-axis position as the stage center of gravity (cg). If not, then additional actuators are used, implemented as described above, to create a net force in the same plane as the stage center of gravity cg. For instance, referring to FIG. 7a, if the actuators can not be located in the stage center of gravity xy plane, then a minimum of two additional actuators are required. An exemplary such arrangement is illustrated in FIG. 7b.

The mass of the stage in the x and y directions may differ so the respective masses are used in the above $\Sigma F_x$ and $\Sigma F_y$ equations. The stage's mass can differ for instance if a sub-stage moving along the y-axis rides on top of a stage moving along the x-axis.

Figure 8:
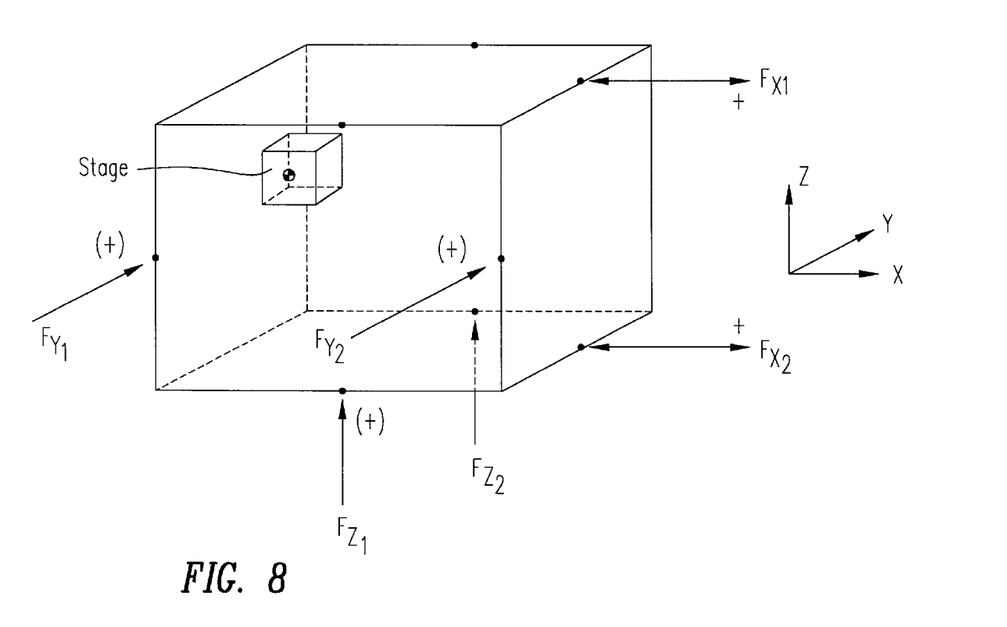

An exemplary arrangement of RFC actuators around a cube (three dimensions) that encloses a six degrees of freedom moving stage is shown in FIG. 8.

This arrangement is governed by these equations:

$\Sigma F_x = m_x \ddot{x}$; so $F_{x1}+F_{x2}=m_x\ddot{x}$.

$\Sigma F_y = m_y \ddot{y}$; so $F_{y1}+F_{y2}=m_y\ddot{y}$.

$\Sigma F_z = m_z \ddot{z}$; so $F_{z1}+F_{z2}=m_z\ddot{z}$.

As described above, the masses $m_x$, $m_y$ and $m_z$ may be equal or may differ.

Figure 9:
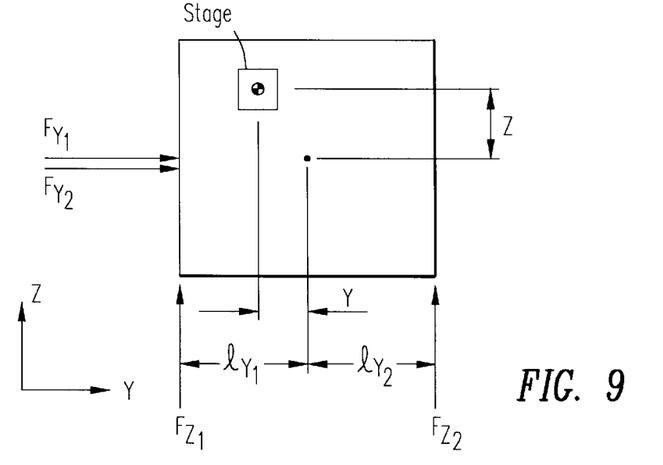

With reference to FIG. 9 which shows a yz projection of the three dimensional cube of FIG. 8, the following equation allows one to sum the moments about the x-axis:

$(F_{z2})(l_{y2}-y)-(F_{z1})(l_{y1}+y)+(F_{y1}+F_{y2})z=I_{xx}\theta_x$.

Figure 10:
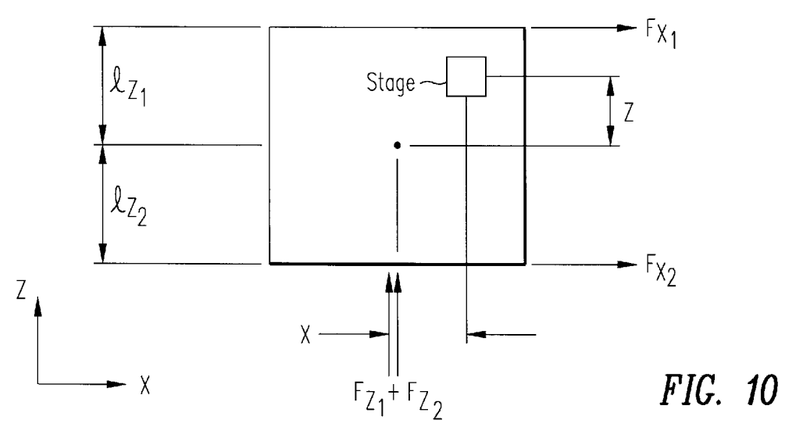

With reference to FIG. 10 the sum of the moments about the y-axis is:

$\Sigma m_y = I_{yy}\theta_y$, and $(Fx_1)(l_{z1}-z)-(Fx_2)(l_{z2}+z)+(F_{z1}+F_{z2})x=I_{yy}\theta_y$.

Figure 11:
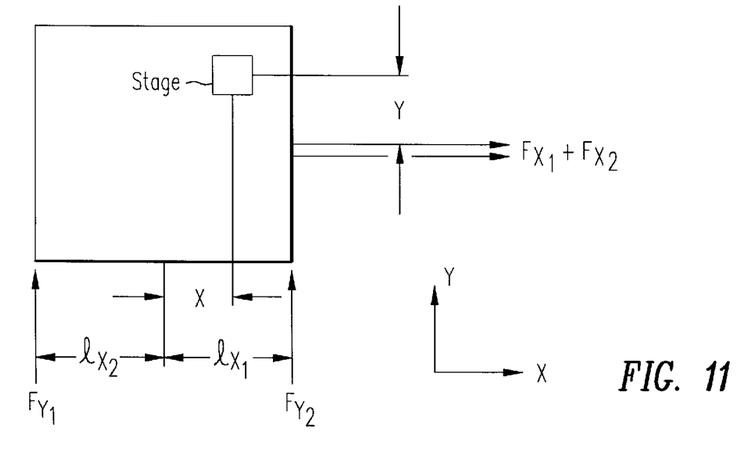

With reference to FIG. 11 the sum of the moments about the z-axis is:

$\Sigma m_z = I_{zz}\theta_z$ and $(F_{y2})(l_{x1}-x)-(F_{y1})(l_{x2}+x)+(F_{x1}+F_{x2})y=I_{zz}\theta_z$ Reaction forces need not be applied outside the range of travel of the stage, i.e., RFC (reaction force cancellation) actuators may be placed almost anywhere, limited by machine design considerations and maximum force capability of the actuators. For example, in the one degree of freedom example, the desired net reaction cancellation force is not between actuators but instead outside, so the force required from one actuator is greater than the net force desired. A minimum of six actuators is required to control six degrees of freedom.

This disclosure is illustrative and not limiting; further modifications will be apparent to one skilled in the art in light of this disclosure and are intended to fall within the scope of the appended claims.

I claim:

1. A method for compensating for reaction forces on a base which supports a stage which rides on the base on at least one bearing, where the stage is accelerated on the base in a first direction, thereby exerting a reaction force and moment on the base, comprising the step of:

exerting a compensating force on the base in a direction having an axis passing through a center of gravity of the stage and lying parallel to the first direction.

2. The method of claim 1, wherein the reaction force and moment on the base is exerted by a linear actuator moving the stage relative to the base, wherein the step of exerting a compensating force comprises the steps of:

mounting the linear actuator on the base; and coupling the base to a foundation by at least one actuator exerting the compensating force on the base, such that a net force vector passes through the center of gravity of the stage and in a direction of travel of the stage.

3. The method of claim 1, wherein the force on the base is exerted by a linear actuator moving the stage relative to the base, wherein the step of exerting a compensating force vector comprises the steps of:

flexibly mounting the linear actuator on the base; and coupling the linear actuator to a foundation by a link rigid in the first direction and flexible in other directions, wherein the link extends parallel to the first direction.

4. The method of claim 1, further comprising the steps of:

accelerating the stage in a plurality of additional degrees of freedom in addition to the first direction; and exerting a compensating force and moment in a direction corresponding to that of each of the additional degrees of freedom.

5. A stage assembly comprising:

a base;

a stage movable on the base in a first direction on at least one bearing;

a stage actuator for accelerating the stage on the base, thereby exerting a force on the base; and a mechanism applying a compensating force on the base in a direction having an axis passing through a center of gravity of the stage and lying parallel to the first direction.

6. The stage assembly of claim 5, wherein the mechanism includes at least one base actuator coupled between the base and a foundation of the stage assembly, the base actuator exerting a force on the base, such that a net force passes through the center of gravity of the stage in a direction parallel to the first direction.

7. The stage assembly of claim 6, wherein the stage actuator is fixedly mounted to the base, and further comprising at least one additional base actuator coupled between the foundation and the base.

8. The stage assembly of claim 6, wherein the base actuator is a voice coil motor.

9. The stage assembly of claim 5, wherein the stage actuator is flexibly mounted on the base, and the mechanism comprises a member lying parallel to the first direction and being rigid in the first direction and flexibly coupled in other directions between the stage actuator and a foundation of the stage assembly.

10. The stage assembly of claim 9, wherein the center of gravity of the stage actuator lies along an axis defined by the stage center of gravity and an axis of the member.

11. The stage assembly of claim 9, wherein the member is coupled to each of the foundation and the stage actuator by flexible joints.

12. The stage assembly of claim 10, wherein a force exerted on the stage by the stage actuator is exerted along an axis not passing through a center of gravity of the stage.

13. The stage assembly of claim 4, wherein the stage is movable in a plurality of additional degrees of freedom, and further comprising:

a plurality of additional stage actuators each coupled to the stage for accelerating the stage in directions corresponding to each of the additional degrees of freedom; and a plurality of additional base actuators each coupled between the stage and the foundation, each of the additional base actuators exerting a force on the base in a direction having an axis parallel to one of the additional degrees of freedom.

14. The stage assembly of claim 4, wherein the stage is movable in a plurality of additional degrees of freedom, and further comprising:

a plurality of additional stage actuators each coupled to the stage for accelerating the stage in directions corresponding to each of the additional degrees of freedom; and a plurality of additional base actuators each coupled between the stage and the foundation, each of the additional base actuators exerting a moment on the base about an axis parallel to an axis of the additional degrees of freedom.

15. The stage assembly of claim 7, wherein the base actuators exert a net reaction cancellation force on the base along an axis passing through the center of gravity of the stage.

* * * * *